United States Patent
Gianesello

(10) Patent No.: US 7,982,571 B2
(45) Date of Patent: Jul. 19, 2011

(54) INDUCTANCE WITH A SMALL SURFACE AREA AND WITH A MIDPOINT WHICH IS SIMPLE TO DETERMINE

(75) Inventor: Frédéric Gianesello, Saint Pierre d'Albigny (FR)

(73) Assignee: STMicroelectronics S.A., Montrouge (FR)

( * ) Notice: Subject to any disclaimer, the term of this patent is extended or adjusted under 35 U.S.C. 154(b) by 65 days.

(21) Appl. No.: 12/179,847

(22) Filed: Jul. 25, 2008

(65) Prior Publication Data

US 2009/0027150 A1 Jan. 29, 2009

(30) Foreign Application Priority Data

Jul. 27, 2007 (FR) .................................. 07 56764

(51) Int. Cl.
*H01F 5/00* (2006.01)
*H01F 27/28* (2006.01)

(52) U.S. Cl. ........................................ 336/200; 336/232

(58) Field of Classification Search ................ 336/200, 336/232
See application file for complete search history.

(56) References Cited

U.S. PATENT DOCUMENTS

| | | | |
|---|---|---|---|
| 6,870,457 B2 * | 3/2005 | Chen et al. ..................... | 336/200 |
| 2004/0075521 A1 * | 4/2004 | Yu et al. ........................ | 336/200 |
| 2004/0103522 A1 * | 6/2004 | Ahn et al. ..................... | 29/602.1 |

OTHER PUBLICATIONS

Chen, W. et al. "Symmetric 3D Passive Components for RF ICs Application." *IEEE Radio Frequency Integrated Circuits Symposium*, pp. 599-602; 2003.
French Search Report dated Feb. 27, 2008 from French Patent Application No. 07/56764.

* cited by examiner

*Primary Examiner* — Anh T Mai
*Assistant Examiner* — Ronald W Hinson
(74) *Attorney, Agent, or Firm* — Lisa K. Jorgenson; Wolf, Greenfield & Sacks, P.C.; James H. Morris

(57) ABSTRACT

An inductance formed in a stack of insulating layers, the inductance comprising first and second access terminals and first and second half-loops distributed in the stack of insulating layers on a number of distinct levels greater than or equal to four. For each level, each first half-loop is at least partly symmetrical to one of the second half-loops. All the first half-loops are series-connected according to a first succession of first half-loops to form first loops between the first access terminal and a midpoint and all the second half-loops are series-connected according to a second succession of second half-loops to form second loops between the second output terminal and the midpoint.

13 Claims, 1 Drawing Sheet

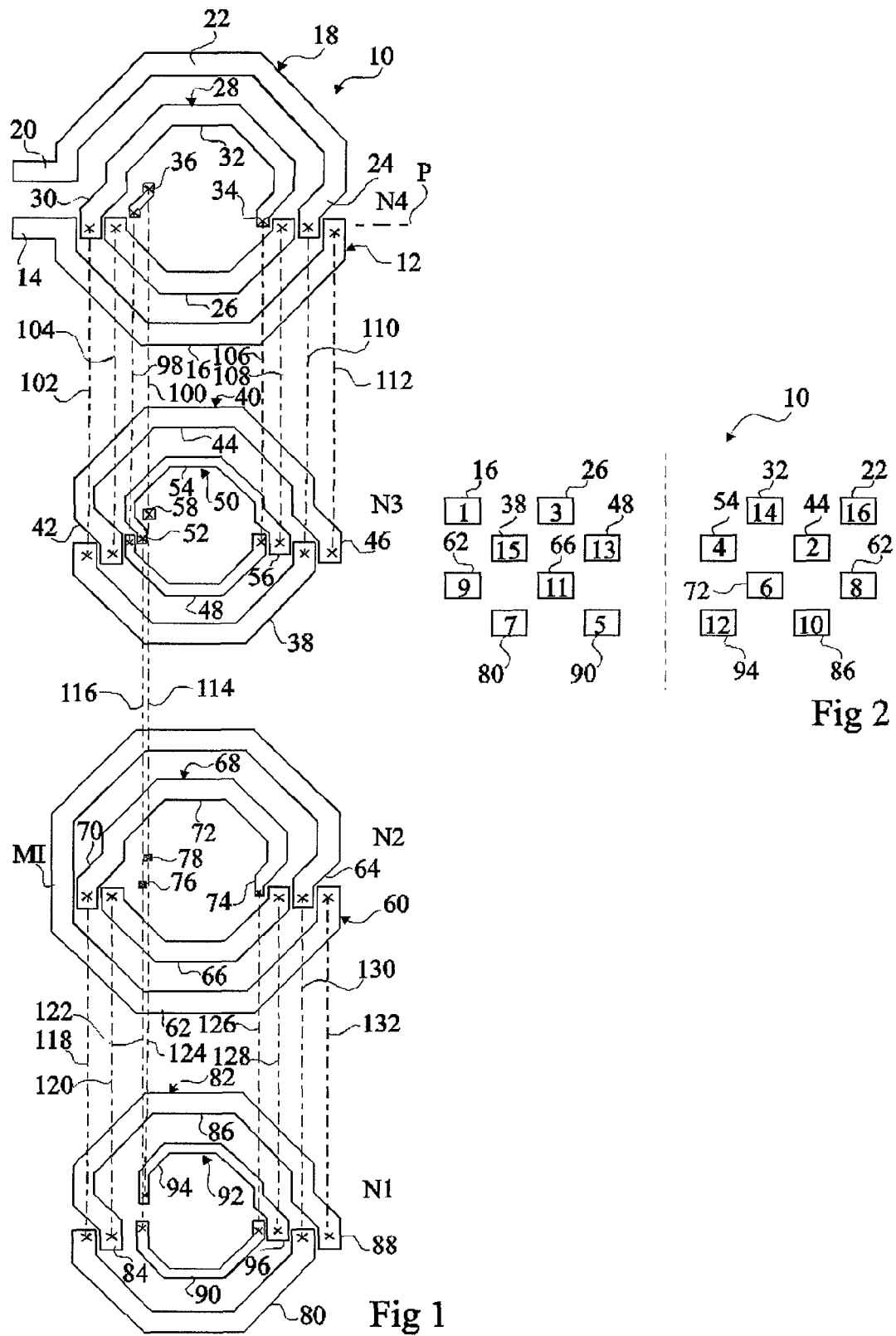

INDUCTANCE WITH A SMALL SURFACE AREA AND WITH A MIDPOINT WHICH IS SIMPLE TO DETERMINE

BACKGROUND OF THE INVENTION

1. Field of the Invention

The present invention relates to an inductance structure intended to be used, for example, in low-noise amplifiers, mixers, voltage-controlled oscillators, passive filters, transformers, etc.

2. Discussion of the Related Art

To obtain an inductance having a significant value but which takes up a small surface area, a possibility is to form the inductance loops with metal tracks, belonging to different metallization levels, which are more or less stacked along a privileged direction.

An inductance generally comprises two main access terminals. For certain applications, in addition to the main access terminals, it is desirable to have an additional access terminal at the level of a specific point of the inductance for which the voltage between the additional access terminal and one of the main access terminals is opposite to the voltage between the additional access terminal and the other main access terminal. Such a point is called the inductance midpoint and the additional access terminal is called the differential access terminal. The midpoint actually corresponds to the inductance point for which the inductive and resistive components of the inductance between one of the main access terminals and the midpoint are identical respectively to the inductive and resistive components of the inductance between the midpoint and the other main access terminal.

It is desirable for the inductance to have a structure enabling simply and systematically determining the position of the midpoint. As an example, when the inductance is formed of a single circular loop, with the two opposite ends of the loop forming the main access terminals, the midpoint corresponds to the loop point diametrically opposite to the main access terminals. However, as soon as the inductance comprises loops formed by metal tracks of several metallization levels, it may be difficult to simply and systematically determine the midpoint position. A difficulty is due to the fact that the materials used to form the metal tracks may be different from one metallization level to the other. As an example, for certain CMOS processes, aluminum may be used for the last metallization level while copper may be used for the other metallization levels. Another difficulty results from the fact that the thicknesses of the metal tracks may be different from one metallization level to the other.

Further, it is desirable for the midpoint to be easily accessible, that is, generally for the midpoint to be on a loop located at the periphery of the inductance.

SUMMARY OF THE INVENTION

There is a need for an inductance formed by metal tracks of several metallization levels and comprising a midpoint that can be easily determined.

There is also a need for an inductance wherein the determination of the midpoint is independent from the type of material used in the metallization levels.

There is also a need for an inductance that may be formed by conventional integrated circuit manufacturing processes.

Thus, one embodiment of the present invention provides an inductance formed in a stack of insulating layers, the inductance comprising first and second access terminals and first and second half-loops distributed in the stack of insulating layers on a number of distinct levels greater than or equal to four. For each level, each first half-loop is at least partly symmetrical to one of the second half-loops. All the first half-loops are series-connected according to a first succession of first half-loops to form first loops between the first access terminal and a midpoint and all the second half-loops are series-connected according to a second succession of second half-loops to form second loops between the second output terminal and the midpoint.

According to an embodiment, the rank of each second half-loop in the second succession is identical to the rank of the first half-loop in the first succession which is at least partly symmetrical to said second half-loop.

According to an embodiment, the number of levels is even, the levels being distributed in distinct pairs of adjacent levels and, for each pair, all the first half-loops of said pair being series-connected, one after the other, and all the second half-loops of said pair being series-connected, one after the other.

According to an embodiment, with each insulating layer is associated a metallization level from among several metallization levels, at least one of the first or second half-loops comprising at least two tracks of different metallization levels aligned along the insulating layer stack direction and connected to one another along their entire length.

According to an embodiment, the inductance comprises, for each level, a least four first half-loops and at least four second half-loops.

According to an embodiment, the midpoint is formed at the junction between one of the first half-loops and one of the second half-loops located at the periphery of the inductance.

The foregoing objects, features, and advantages will be discussed in detail in the following non-limiting description of specific embodiments in connection with the accompanying drawings.

BRIEF DESCRIPTION OF THE DRAWINGS

FIG. 1 is a simplified perspective view of the metal tracks of an embodiment of a two-loop inductance formed on four loop levels; and FIG. 2 is a simplified cross-section view of the inductance of FIG. 1 illustrating an example of the order in which the current flows in the inductance loops.

DETAILED DESCRIPTION

For clarity, the same elements have been designated with the same reference numerals in the different drawings and, further, as usual in the representation of semiconductor structures, the various drawings are not to scale.

An embodiment of the present invention will now be described for an inductance made in integrated fashion. However, the present invention may also apply to a monolithically-formed inductance.

In the following description, an inductance formed in a circuit comprising a stack of insulating layers covering a substrate is considered. With each insulating layer are associated metal tracks of a given metallization level. Call the first metallization the metallization level used to form the inductance for which the tracks are closest to the substrate and call the last metallization level the metallization used to form the inductance for which the tracks are most distant from the substrate. An inductance loop corresponds to one or several metal tracks, possibly of different metallization levels, connected to one another to be electrically equivalent to a single track having the shape of a loop. A half-loop corresponds to one or several metal tracks, possibly of different metallization levels, connected to one another to be electrically equivalent to a single track having the shape of a half-loop.

Further, in the following description, a track of a given metallization level is said to be aligned with a track of another metallization level if, as seen along the insulating layer stack direction, the tracks substantially fully overlap. A track of a given metallization level is said to be partially aligned with a track of another metallization level if, as seen along the insulating layer stacking direction, the tracks substantially fully overlap only along part of their length.

In the following description, a half-loop of an inductance may comprise a metal track of a single metallization level or several metal tracks of successive metallization levels which are aligned and connected to one another along their entire length by conductive vias. In both cases, the half-loop is considered to belong to a single loop level. In the following description, the loop level for which a half-loop only comprises a track of the first metallization level or comprises tracks of the first metallization levels which are aligned and connected to one another along their entire length by conductive vias is called first loop level. The loop level for which a half-loop only comprises a track of the last metallization level or comprises tracks of the last metallization levels which are aligned and connected to one another along their entire length by conductive vias is called last loop level. In the following description, two half-loops are said to be aligned when all the metal tracks which form them are aligned. Further, first and second aligned half-loops are said to be adjacent if there is no third half-loop aligned with the first and second half-loops interposed between the first and second half-loops.

An embodiment of the present invention provides forming, in a stack of insulating layers, an inductance comprising first and second half-loops formed by tracks of several metallization levels. Each first half-loop is substantially symmetrical to one of the second half-loops. All the first half-loops are series-connected to one another to form a first group of loops. Similarly, all the second half-loops are series-connected to one another to form a second group of loops. The inductance midpoint then naturally corresponds to the point located at the junction between the first and second groups. Each group having the same number of half-loops of same type per loop level, the position of the midpoint is independent of the materials used or from the dimensions of the metal tracks for the different metallization levels. According to an embodiment of the present invention, to form the first and second groups, the first half-loops are series-connected to one another between a first access terminal and the midpoint and form a first succession of half-loops in which each first half-loop has a given rank (first, second, third, etc.) or position index. Similarly, the second half-loops are series-connected to one another between the second access terminal and the midpoint and form a second succession of half-loops in which each second half-loop has a given rank. For each rank, the first half-loop of said rank in the first succession is symmetrical to the second half-loop of said rank in the second succession. To form the first and second half-loop successions, an embodiment provides, for each distinct pair of adjacent loop levels, following the first half-loops of said pair and repeating the operation for the next pairs of loop levels until all the first half-loops, that is, half of the half-loops, have been followed. The midpoint is then reached. The second half-loops are similarly followed.

FIG. 1 is a simplified perspective view of the metal tracks of an embodiment of an inductance 10 comprising two loops per loop level over four loop levels N1 to N4, with level N1 corresponding to the first loop level. As an example, the half-loops of loop level N1 comprise pairs of metal tracks of two successive metallization levels which are aligned and connected along their entire length. Similarly, the half-loops of loop level N2 comprise pairs of metal tracks of two successive metallization levels which are aligned and interconnected along their entire length. The half-loops of loop level N3 comprise metal tracks of the penultimate metallization level and the half-loops of loop level N4 comprise metal tracks of the last metallization level. For loop levels N1 and N2, a metal track or portion thus corresponds to stacked metal tracks of two metallization levels.

In loop level N4, inductance 10 comprises a track 12 comprising a rectilinear portion 14 forming a first access terminal, extending in a portion 16 substantially having the shape of a half-hexagon and corresponding to a half-loop. Inductance 10 further comprises a track 18 comprising a rectilinear portion 20, forming a second access terminal, extending in a portion 22 substantially having the shape of a half-hexagon and corresponding to a half-loop. Inductance 10 further comprises a track 26 substantially having the shape of a half-hexagon and corresponding to a half-loop. Inductance 10 further comprises a track 28 comprising a connection portion 30 extending in a portion 32 substantially having the shape of a half-hexagon and corresponding to a half-loop, portion 32 extending in a connection portion 34. Inductance 10 further comprises a track 36 forming a connection bridge. Portions 16 and 22 are substantially symmetrical with respect to a plane P shown by a broken line. Further, track 26 and portion 32 are substantially symmetrical with respect to plane P. Track 26 is formed inside of portion 16 and portion 32 is formed inside of portion 22.

In loop level N3, inductance 10 comprises a track 38 substantially having the shape of a half-hexagon and corresponding to a half-loop. Inductance 10 further comprises a track 40 comprising a connection portion 42 extending in a portion 44 substantially having the shape of a half-hexagon and corresponding to a half-loop, with portion 44 extending in a connection portion 46. Inductance 10 further comprises a track 48 substantially having the shape of a half-hexagon and corresponding to a half-loop. Inductance 10 further comprises a track 50 comprising a connection portion 52 extending in a portion 54 substantially having the shape of a half-hexagon and corresponding to a half-loop, portion 54 extending in a connection portion 56. Inductance 10 further comprises a connection pad 58. Track 38 and portion 44 are substantially symmetrical with respect to a plane P. Track 48 and portion 54 are substantially symmetrical with respect to plane P. Track 38 is located, in top view, substantially between portion 16 and track 26. Portion 44 is located, in top view, substantially between portion 22 and portion 32. Track 48 is located, in top view, substantially inside of track 26. Portion 54 is located, in top view, substantially inside of portion 32.

In loop level N2, inductance 10 comprises a track 60 comprising a portion 62 substantially having the shape of a hexagon and corresponding to two half-loops, portion 62 extending in a connection portion 64. Inductance 10 further comprises a track 66 substantially having the shape of a half-hexagon and corresponding to a half-loop. Inductance 10 further comprises a track 68 comprising a connection portion 70 extending in a portion 72 substantially having the shape of a half-hexagon and corresponding to a half-loop, portion 72 extending in a connection portion 74. Inductance 10 further comprises two connection pads 76 and 78. Portion 16 and portion 22 are substantially aligned with portion 62. Track 66 is substantially aligned with track 26. Track 68 is substantially aligned with track 28. Pad 78 is substantially aligned with pad 58 and pad 76 is substantially aligned with the end of connection portion 52.

In loop level N1, inductance 10 comprises a track 80 substantially having the shape of a half-hexagon and corresponding to a half-loop. Inductance 10 further comprises a track 82 comprising a connection portion 84 extending in a portion 86 substantially having the shape of a half-hexagon and corresponding to a half-loop, portion 86 extending in a connection portion 88. Inductance 10 further comprises a track 90 partially having the shape of a half-hexagon and corresponding to a half-loop. Inductance 10 further comprises a track 92 comprising a portion 94 partially having the shape of a half-hexagon and corresponding to a half-loop, portion 94 extending in a connection portion 96. Track 80 is substantially aligned with track 38. Track 82 is substantially aligned with track 40. Track 90 is partially aligned with track 48. Portion 94 is partially aligned with portion 54. Connection portion 96 is substantially aligned with connection portion 56.

The connections between loop levels N4 and N3 are the following. Connection bridge 36 connects a first end of track 48 to pad 58 by vias 98 and 100. Connection portion 30 is connected to a first end of track 38 by a via 102. A first end of track 26 is connected to a connection portion 42 by a via 104. Connection portion 34 is connected to the second end of track 48 by a via 106. The second end of track 26 is connected to connection portion 56 by a via 108. Connection portion 24 is connected to the second end of track 38 by a via 110. The free end of portion 16 is connected to connection portion 46 by a via 112.

The connections between loop levels N3 and N2 are the following. Pad 58 is connected to pad 78 by a via 114. Connection portion 52 is connected to pad 76 by a via 116.

The connections between loop levels N2 and N1 are the following. Connection portion 70 is connected to a first end of track 80 by a via 118. A first end of track 66 is connected to connection portion 84 by a via 120. Pad 76 is connected to a first end of track 90 by a via 122. Pad 78 is connected to the free end of portion 94 by a via 124. Connection portion 74 is connected to the second end of track 90 by a via 126. The second end of track 66 is connected to connection portion 96 by a via 128. Connection portion 64 is connected to the second end of track 80 by a via 130. The free end of portion 62 is connected to connection portion 88 by a via 132.

FIG. 2 illustrates an example of the order in which the current flows in the half-loops of inductance 10 of FIG. 1. FIG. 2 shows boxes symbolizing the half-loops of inductance 10 in cross-section view along a plane perpendicular to plane P. Each box is designated with the reference numeral of the metal track or portion to which it corresponds. In each box is written a number indicating the order in which the current flows in the corresponding half-loop.

Considering that the current starts from access terminal 14, the current flows through portion 16 (box #1). Then, via via 112 and connection portion 46, the current flows through portion 44 (box #2). Then, via connection portion 42 and via 104, the current flows through track 26 (box #3). Then, via via 108 and connection portion 56, the current flows through portion 54 (box #4). Then, via connection portion 52, via 116, pad 76, and via 122, the current flows through track 90 (box #5). Then, via via 126 and connection portion 74, the current flows through portion 72 (box #6). Then, via connection portion 70 and via 118, the current flows through track 80 (box #7). Then, via via 130 and connection portion 64, the current flows through portion 62 (boxes #8 and 9). Then, via via 132 and connection portion 88, the current flows through portion 86 (box #10). Then, via connection portion 84 and via 120, the current flows through portion 66 (box #11). Then, via via 128 and connection portion 96, the current flows through portion 94 (box #12). Then, via via 124, pad 78, via 114, pad 58, via 100, connection bridge 36, and via 98, the current flows through track 48 (box #13). Then, via via 106 and connection portion 34, the current flows through portion 32 (box #14). Then, via connection portion 30 and via 102, the current flows through track 38 (box #15). Then, via via 110 and connection portion 24, the current flows though portion 22 (box #16) to reach access terminal 20.

Inductance 10 comprises a midpoint MI at the intersection between plane P and portion 62. Indeed, as appears from the current flow order previously described in relation with FIG. 2, the electric path connecting one or the other of access terminals 14 or 20 to midpoint MI comprises an "internal" half-loop and an "external" half-loop for each loop level N1 to N4. Thereby, these two electric paths have the same resistance and inductance characteristics, even though the resistance and inductance characteristics of the half-loops may be different from one loop level to the other.

In particular, the first metallization levels may correspond to copper tracks and the last metallization level may correspond to aluminum tracks. Further, the metal track thicknesses may be different from one metallization level to the other. Further, for certain loop levels, the associated half-loops may correspond to the stack of two metal tracks or more successive metallization levels, connected together along their entire length by conductive vias.

The previously-described embodiment relates to an inductance formed on four loop levels comprising two loops per loop level. It should however be clear that the present invention may be implemented for an inductance comprising a greater number of loop levels and/or a greater number of loops per loop level. Generally, when the inductance comprises an even number of loop levels, the present invention can be implemented by gathering the loop levels in distinct pairs of adjacent loop levels. An electric path is then defined from a first access terminal of the inductance to the midpoint by following half of the half-loops of a first pair of adjacent loop levels, then half of the half-loops of a second pair of adjacent loop levels, etc., to reach half of the half-loops of the last pair of adjacent loop levels. The midpoint is then reached. The electric path from the midpoint to the second access terminal of the inductance is obtained by symmetrically following the remaining half-loops from the last pair to the first pair of loop levels. More specifically, for each pair of adjacent loop levels, a half-loop of one of the loop levels in the pair, then a half-loop of the other loop level, are successively followed, until half of the half-loops in the pair have been followed.

Specific embodiments of the present invention have been described. Various variations and modifications will occur to those skilled in the art. In particular, in the previously-described embodiment, the main access terminals of the inductance are formed in the last loop level while the inductance midpoint is formed in a lower loop level. It should be clear that the midpoint and the access terminals may be formed in loop levels different from those described previously, especially according to the constraints of connection of the inductance to other electronic components. As an example, the inductance midpoint may be formed in the last loop level and the main access terminals of the inductance may be formed in a lower loop level.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An inductor formed in a stack of insulating layers, the inductor comprising:
   first and second access terminals; and
   first and second groups of half-loops distributed in the stack of insulating layers on a number of distinct loop levels greater than or equal to four,
   wherein:
      for each loop level, each half-loop of the first group is at least partly symmetrical to one half-loop of the second group;
      all the half-loops of the first group are series-connected according to a first succession of first half-loops to form the first group between the first access terminal and a midpoint;
      all the half-loops of the second group are series-connected according to a second succession of second half-loops to form the second group between the second access terminal and the midpoint;
      each loop level includes at least two first half-loops and at least two second half-loops; and
      the midpoint is formed at the junction between one of the first half-loops and one of the second half-loops located at the inductor periphery, and wherein the loop levels comprise metal tracks at least of first, second, third, and fourth metallization levels, and
   in the first metallization level:
      a first track forming a first half-loop and connected to the first access terminal;
      a second track at least partly symmetrical to the first track with respect to a plane and forming a second half-loop, the second track being connected to the second access terminal;
      a third track at least partly extending inside of the first track and forming a third half-loop; and
      a fourth track at least partly extending inside of the second track, the fourth track being at least partly symmetrical to the third track with respect to said plane and forming a fourth half-loop;
   in the second metallization level:
      a fifth track forming a fifth half-loop, the fifth track being series-connected between the fourth track and the second track;
      a sixth track at least partly symmetrical to the fifth track with respect to said plane and forming a sixth half-loop, the sixth track being series-connected between the third track and the first track;
      a seventh track at least partly extending inside of the fifth track and forming a seventh half-loop, the seventh track being series-connected to the fourth track; and
      an eighth track at least partly extending inside of the sixth track, the eighth track being at least partly symmetrical to the seventh track with respect to said plane and forming an eighth half-loop, the eighth track being series-connected to the third track;
   in the third metallization level:
      a ninth track at least partially aligned with the first track and the second track and forming ninth and tenth half-loops;
      a tenth track at least partially aligned with the third track and forming an eleventh half-loop; and
      an eleventh track at least partially aligned with the fourth track and forming a twelfth half-loop; and
   in the fourth metallization level:
      a twelfth track at least partially aligned with the fifth track and forming a thirteenth half-loop, the twelfth track being series-connected between the eleventh track and the ninth track;
      a thirteenth track at least partially aligned with the sixth track and forming a fourteenth half-loop, the thirteenth track being series-connected between the tenth track and the ninth track;
      a fourteenth track at least partially aligned with the seventh track and forming a fifteenth half-loop, the fourteenth track being series-connected between the eighth track and the eleventh track; and
      a fifteenth track at least partially aligned with the eighth track and forming a sixteenth half-loop, the fifteenth track being series-connected between the seventh track and the tenth track.

2. The inductor of claim 1, wherein the rank of each second half-loop in the second succession is identical to the rank of the first half-loop in the first succession which is at least partly symmetrical to said second half-loop.

3. The inductor of claim 1, wherein the number of loop levels is even, the loop levels being distributed in distinct pairs of adjacent levels and all the half-loops of the first group of one of said distinct pairs being series-connected one after the other and all the half-loops of the second group of the one of said distinct pairs being series-connected one after the other.

4. The inductor of claim 1, wherein, in top view, the fifth track extends at least partly between the first track and the third track, the sixth track at least partly extending between the second track and the fourth track, the seventh track at least partly extending inside of the third track and the eighth track at least partly extending inside of the fourth track.

5. The inductor of claim 1, wherein each insulating layer is associated with a metallization level from among several metallization levels, at least one of the first or second groups of half-loops comprising at least two tracks of different metallization levels aligned at least in part along the insulating layer stacking direction and connected to one another by at least one conductive via.

6. An electronic circuit, such as a low-noise amplifier, a mixer, a voltage-controlled oscillator, a passive filter, or a transformer, at least comprising the inductor of claim 1.

7. The inductor of claim 1, wherein:
   the metallization levels are disposed on a substrate; and
   the first group of half-loops and the second group of half-loops are configured such that a position of an inductance midpoint of the inductor is independent of materials used to form, and dimensions of, the conductive tracks for different metallization levels of the plurality of metallization levels.

8. The inductor of claim 1, wherein a first number of half-loops in the first group of half-loops and a second number of half-loops in the second group of half-loops is the same.

9. The inductor of claim 1, wherein:
   the first group of half-loops includes a first series-connected succession of half-loops, wherein alternate half-loops of the first series-connected succession of half-loops are on different loop levels of the plurality of loop levels; and
   the second group of half-loops includes a second series-connected succession of half-loops, wherein alternate half-loops of the second series-connected succession of half-loops are on different loop levels of the plurality of loop levels.

10. The inductor of claim 9, wherein the different loop levels occupied by the alternate half-loops of the first series-connected succession of half-loops and the different loop levels occupied by the alternate half-loops of the second series-connected succession are a same set of different loop levels.

11. The inductor of claim 1, wherein:
the metallization levels are disposed on a substrate;
a first metallization level of the metallization levels includes a first metal; and
a second metallization level of the metallization levels includes a second metal different from the first metal.

12. The inductor of claim 1, wherein:
first conductive tracks formed in a first metallization level of the metallization levels, have a first track dimension; and
second conductive tracks formed in a second metallization level of the metallization levels, have a second track dimension different from the first track dimension.

13. The inductor of claim 1, wherein
the metallization levels are disposed on a substrate; and
the conductive tracks are a substantially same pattern on at least two loop levels.

* * * * *